US008148802B2

(12) United States Patent
Collazo et al.

(10) Patent No.: US 8,148,802 B2
(45) Date of Patent: Apr. 3, 2012

(54) PASSIVATION OF ALUMINUM NITRIDE SUBSTRATES

(75) Inventors: Ramon R. Collazo, Raleigh, NC (US); Zlatko Sitar, Apex, NC (US); Rafael Dalmau, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 13/028,505

(22) Filed: Feb. 16, 2011

(65) Prior Publication Data

US 2011/0140124 A1    Jun. 16, 2011

Related U.S. Application Data

(62) Division of application No. 12/182,475, filed on Jul. 30, 2008, now Pat. No. 7,915,178.

(51) Int. Cl.
*H01L 23/58* (2006.01)
(52) U.S. Cl. ................... 257/632; 257/615; 257/631
(58) Field of Classification Search ............... 257/631, 257/632, 615
See application file for complete search history.

(56) References Cited

U.S. PATENT DOCUMENTS

| 5,296,119 | A | 3/1994 | Moustakas |
| 5,385,862 | A | 1/1995 | Moustakas |
| 5,633,192 | A | 5/1997 | Moustakas et al. |
| 5,677,538 | A | 10/1997 | Moustakas et al. |
| 5,686,738 | A | 11/1997 | Moustakas |
| 5,725,674 | A | 3/1998 | Moustakas et al. |
| 5,821,170 | A | 10/1998 | Klingbeil, Jr. et al. |
| 5,847,397 | A | 12/1998 | Moustakas |
| 5,849,170 | A | 12/1998 | Djokic et al. |
| 6,123,768 | A | 9/2000 | Moustakas |
| 6,284,042 | B1 | 9/2001 | Sasaoka |
| 6,548,405 | B2 | 4/2003 | Kraus et al. |
| 6,576,054 | B1 | 6/2003 | Melnik et al. |
| 6,596,079 | B1 * | 7/2003 | Vaudo et al. ............... 117/97 |
| 2003/0198837 | A1 | 10/2003 | Craven et al. |

(Continued)

FOREIGN PATENT DOCUMENTS

JP    2002270525    9/2002

(Continued)

OTHER PUBLICATIONS

Dalmau, R. et al, "X-ray photoelectron spectroscopy characterization of aluminum nitride surface oxides: thermal and hydrothermal evolution," 2007 Journal of Electronic Materials, vol. 36 No. 4, p. 414-419.*

(Continued)

*Primary Examiner* — Charles Garber
*Assistant Examiner* — Bryan Junge
(74) *Attorney, Agent, or Firm* — Womble Carlyle Sandridge & Rice, LLP

(57) ABSTRACT

The present invention provides methods of protecting a surface of an aluminum nitride substrate. The substrate with the protected surface can be stored for a period of time and easily activated to be in a condition ready for thin film growth or other processing. In certain embodiments, the method of protecting the substrate surface comprises forming a passivating layer on at least a portion of the substrate surface by performing a wet etch, which can comprise the use of one or more organic compounds and one or more acids. The invention also provides aluminum nitride substrates having passivated surfaces.

36 Claims, 3 Drawing Sheets

U.S. PATENT DOCUMENTS

2007/0042560 A1    2/2007   Sumiya et al.

FOREIGN PATENT DOCUMENTS

WO    WO 2005004213    1/2005

OTHER PUBLICATIONS

Ammu et al., "Epitaxial Growth of GaN for Optoelectronic Applications," cited online Apr. 7, 2005.

Campman et al., "Surface Preparation of Aluminum Nitride for Metallization," *Materials and Manufacturing Processes*, 2003, pp. 877-890, vol. 18, No. 6.

Collazo et al., "Polarity Control of GaN Thin Films Grown by Metalorganic Vapor Phase Epitaxy," *Phys. Stat. Sol.*, 2005, pp. 2117-2120, vol. 2, No. 7.

Huang et al., "Comparative Study of Ga- and N-Polar GaN Films Grown on Sapphire Substrates by Molecular Beam Epitaxy," *J. Vac. Sci. Technol. B*, 2002, pp. 2256-2264, vol. 20, No. 6.

Kim et al., "The Effects of Nitridation on Propertis of GaN Grown on Sapphire Substrate by Metal-Organic Chemical Vapour Deposition," *Semicond. Sci. Technol.*, 1999, pp. 557-560, vol. 14.

Krnel et al., "Reactivity of Aluminum Nitride Powder in Dilute Inorganic Acids," *J. Am. Ceram. Soc.*, 2000, pp. 1375-1378, vol. 83.

Loretz et al., "Hydrogenated Aluminum Nitride Thin Films Prepared by R.F. Reactive Sputtering. Infrared and Structural Properties,".

Losurdo et al., "The Effect of Substrate nitridation Temperature and Buffer Design on the Quality of GaN Epitaxial Films," *10$^{th}$ European Workshop on MOVPE*, Lecce, Italy, Jun. 8-11, 2003.

Mita et al., "Polarity Control of GaN Films Grown by Metal Organic chemical Vapor Depostion on (0001) Sapphire Substrates," *Mater. Res. Soc. Symp. Proc.*, 2005, pp. E320.1-E3.20.6, vol. 831.

Stutzmann et al., "Playing with Polarity," *Phys. Stat. Sol. (b)*, 2001, pp. 505-512, vol. 228, No. 2.

Svedberg et al., "Corrosion of Aluminum Nitride (AlN) in Aqueous Cleaning Solutions," *J. Am. Ceram. Soc.*, 2000. pp. 41-46, vol. 83, No. 1, *Thin Solid Films*, 1995, pp. 15-21, vol. 265.

Tischler, "Advances in Metalorganic Vapor-Phase Epitaxy," *IBM J. Res. Develop.*, 1990, pp. 828-848, vol. 34, No. 6.

\* cited by examiner

PASSIVATION OF ALUMINUM NITRIDE SUBSTRATES

CROSS-REFERENCE TO RELATED APPLICATIONS

The present patent application is a division of U.S. patent application Ser. No. 12/182,475, filed Jul. 30, 2008, now U.S. Pat. No. 7,915,178 the disclosure of which is incorporated herein by reference in its entirety.

FEDERALLY SPONSORED RESEARCH OR DEVELOPMENT

The research underlying this invention was supported in part with funds from U.S. Department of Defense Grant No. FA8718-07-C-00020002. The United States Government may have an interest in the subject matter of this invention.

FIELD OF THE INVENTION

The present invention relates to aluminum nitride substrates. In particular, the invention provides methods of protecting such substrates by forming a passivation layer on a surface of the substrate.

BACKGROUND

Group III nitride substrates are increasingly valued for their usefulness in preparation of electrical components. For example, Group III nitride based semiconductors have become a leading material for use in the production of light emitting diodes (LEDs), particularly blue and white LEDs and blue laser diodes, as well as high-power, high-temperature electronics. While Group III nitride substrates have proven extremely useful and versatile, they have also proven somewhat difficult to prepare.

Epitaxial methods can be hindered by the lack of a single crystal Group III nitride substrate, or other high quality single crystal substrates, with the same lattice parameters as the Group III nitride film to be grown thereon. Epitaxial growth of nitrides is often performed on sapphire or silicon carbide substrates. Even with such substrates, though, it can be difficult to provide a substrate having a surface in a condition for optimal film growth. Aluminum nitride substrates can be particularly useful substrates in epitaxial methods; however, AlN substrates cannot typically be stored for long periods of time because of the ease of surface reaction between aluminum and atmospheric oxygen or moisture.

The surface condition of a substrate can be particularly related to the later usefulness of the substrate for thin film growth. For example, surface preparation can influence the nucleation stage of thin film growth and, consequently, the growth morphology of the film. This in turn can determine the electrical and optical properties of the grown film, which is particularly important since these properties need to be well controlled for the fabrication of electronic and optoelectronic devices.

Given the usefulness of the Group III nitride films, and components incorporating such films, it is desirable to have a method for forming a protective layer on aluminum nitride substrates to ensure the substrates remain in optimal condition for later film growth. It is also desirable that such protective layers be easily formed and easily removed. Such methods, as well as aluminum nitride substrates useful in the growth of Group III nitride films, are provided according to the present invention.

SUMMARY OF THE INVENTION

Aluminum nitride substrates are a promising technology for further developing Group III nitride electronic and optoelectronic devices. As a novel substrate material, it is useful to have methods for protecting the surface of the substrate (e.g., such as during storage) so the surface is maintained in a state useful for further epitaxial thin film growth. The present invention provides methods of protecting the surfaces of aluminum nitride substrates by forming a passivation layer thereon that can be easily removed prior to film growth, including in situ removal. The methods of the invention are particularly useful since the surfaces of aluminum nitride substrates are highly susceptible to oxidation, which can be detrimental to the growth of any thin film on the substrate surface.

In one aspect, the invention is directed to a method of protecting a surface of an aluminum nitride substrate. In certain embodiments, the method comprises forming a passivating layer on at least a portion of the substrate surface by applying a wet chemical etch to the substrate surface. The passivating layer can particularly comprise an aluminum hydroxide layer. In certain embodiments, the wet chemical etch comprises an acid etch (i.e., using an acid as the etchant). In other embodiments, the wet chemical etch comprises a base etch (i.e., using a base as the etchant).

The acid etch step can, in certain embodiments, comprise the use of one or more acids. Various acids could be used in the etching step of the invention. Non-limiting examples of that may be used are sulfuric acid, phosphoric acid, and hydrofluoric acid. Combinations of acids could also be used, as well as salts that form acids in aqueous solution.

In some embodiments, it is useful for the acid etch to be carried out at an elevated temperature (i.e., a temperature above room temperature). In specific embodiments, the acid etch can be carried out at a temperature of about 80° C. to about 120° C.

In some embodiments of the invention, it can be useful to carry out one or more specific cleaning steps on the aluminum nitride substrate prior to the acid etch. Although a variety of cleaners could be used to prepare the aluminum nitride substrate for the acid etch, in some embodiments, it can be particularly beneficial to use one or more organic solvents as the cleaner. In specific embodiments, the cleaning step can be carried out multiple times (e.g., two times, three times, or even more times). In such embodiments, it can be useful to use two or more different cleaners in the separate cleaning steps. Non-limiting examples of organic solvents that may be used in the one or more cleaning steps include trichloroethylene, acetone, and methanol.

The above method is particularly useful to form a passivated aluminum nitride substrate. The invention is particularly characterized in that the passivation layer formed on the aluminum nitride substrate can be easily removed in an activation method.

Accordingly, in another aspect, the present invention is directed to a method of activating a passivated aluminum nitride substrate (e.g., an AlN substrate passivated with an aluminum hydroxide layer) covering at least a portion of a surface of the substrate. In certain embodiments, the method comprises performing a thermal anneal of the passivated substrate in the presence of a reactive nitrogen precursor or a reducing agent.

Any material that provides active nitrogen under the annealing conditions described herein can be used according to this aspect of the invention. In specific embodiments, the reactive nitrogen precursor is ammonia.

Similarly, a variety of reducing agents could be used according to the invention in the annealing method. In one particular embodiments, the reducing agent is hydrogen.

The thermal anneal is preferably carried out at a relatively high temperature. For example, in certain embodiments, the thermal anneal is carried out at a temperature of at least about 500° C. In other embodiments, the temperature during the annealing step is between about 500° C. and about 1,500° C. The time of carrying out the anneal step to completely activate the aluminum nitride substrate can vary. In certain embodiments, the annealing time is between about 5 minutes and about 45 minutes.

In another aspect, the present invention provides a passivated aluminum nitride substrate, in particular an aluminum nitride single crystal wafer. The AlN wafer can specifically comprise a surface that is at least partially covered with an aluminum hydroxide passivating layer. In further embodiment, the AlN wafer surface is a polished surface.

BRIEF DESCRIPTION OF THE DRAWINGS

Figure 1:
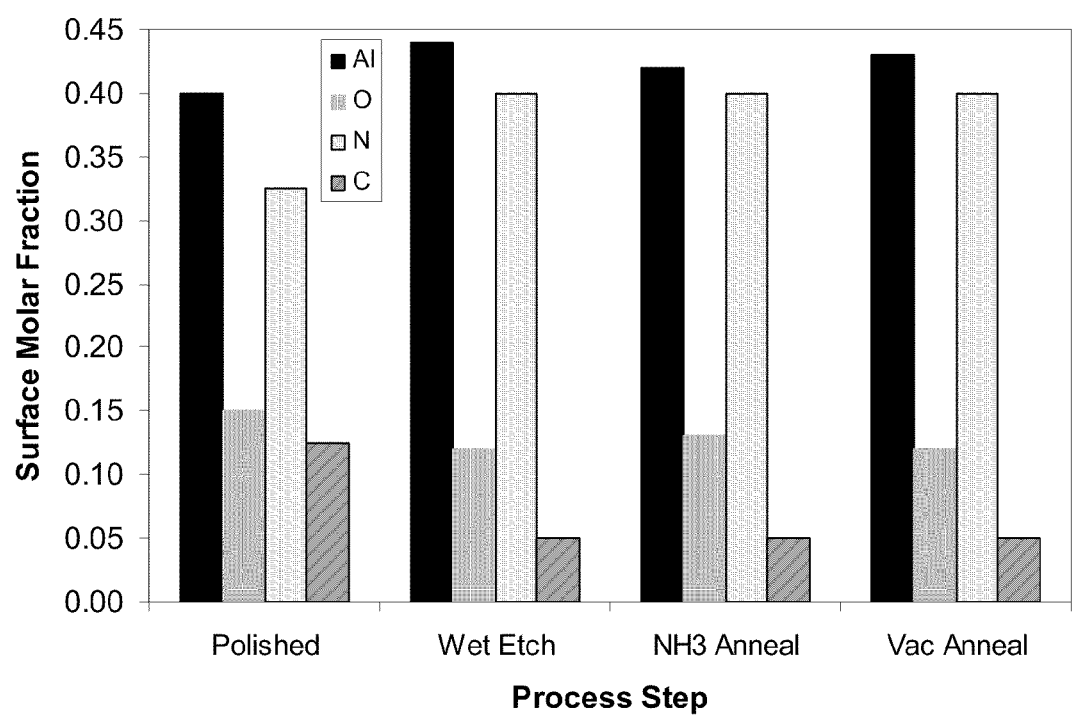
Figure 2:
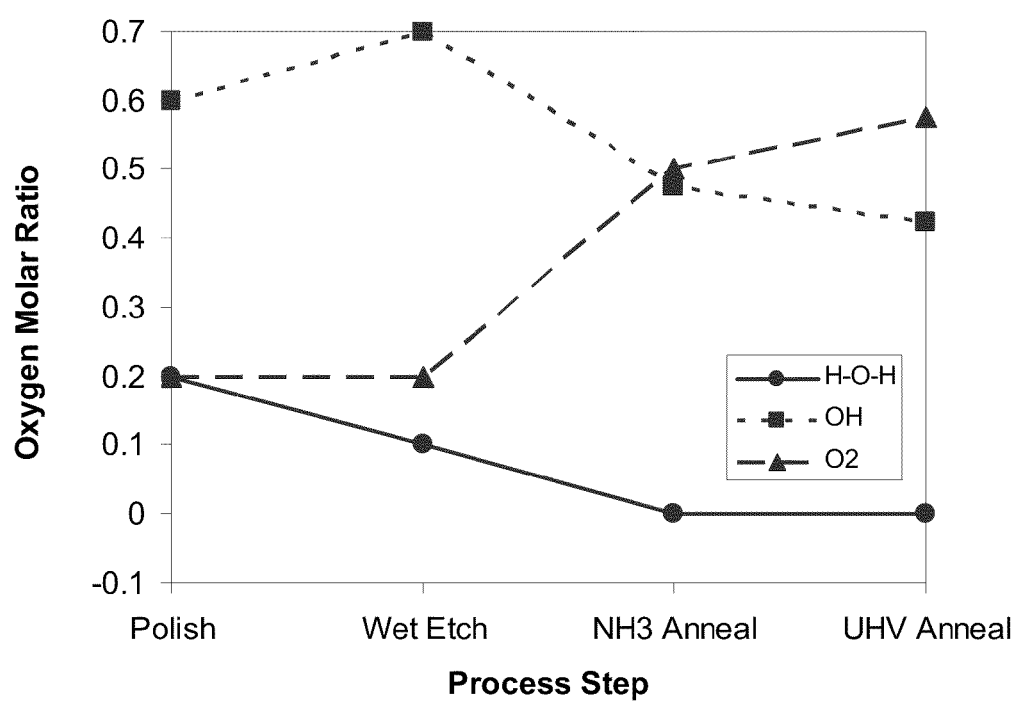
Figure 3:
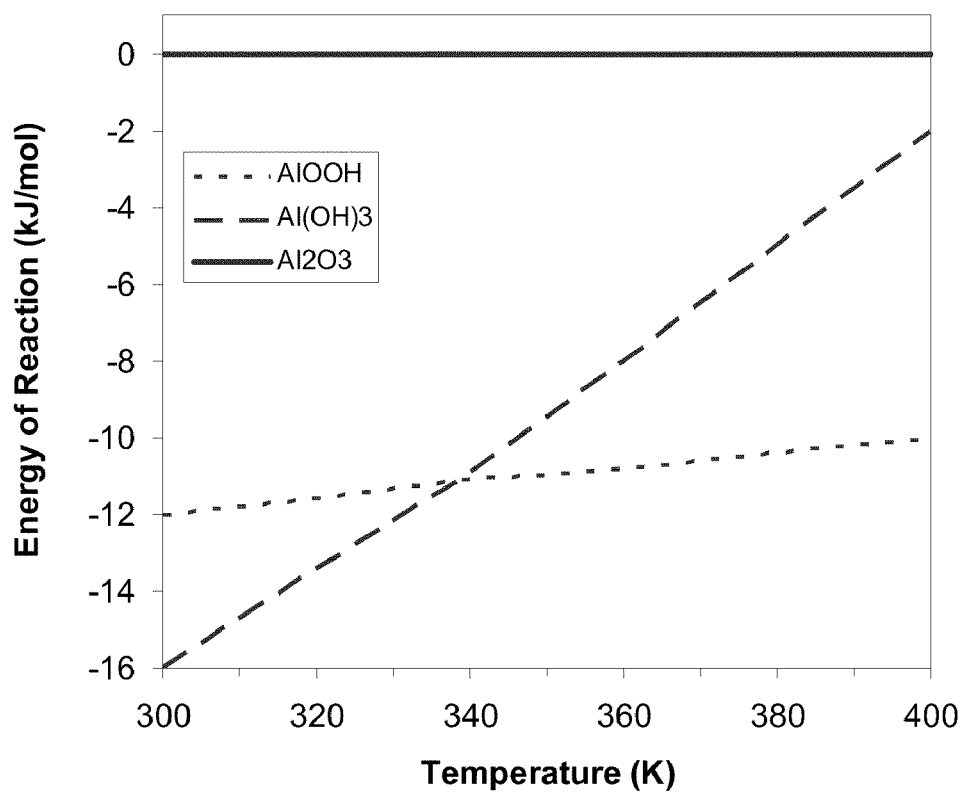

Having thus described the invention in general terms, reference will now be made to the accompanying drawings, which are not necessarily drawn to scale, and wherein:

FIG. 1 is a chart illustrating the surface molar fraction, as determined by X-ray Photoelectron Spectroscopy (XPS), of the species found on the surface of an AlN crystal after undergoing specific treatment processes;

FIG. 2 is a chart illustrating the molar fraction of the type of oxygen bonding to the total oxygen surface molar fraction after undergoing specific treatment processes; and FIG. 3 is a chart illustrating the free energy of the hydration reaction of aluminum oxide as a function of temperature for two different hydroxide products and for sapphire ($Al_2O_3$).

DETAILED DESCRIPTION OF THE INVENTION

The present inventions now will be described more fully hereinafter with reference to the accompanying drawings, in which one, but not all embodiments of the inventions are illustrated. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used in the specification, and in the appended claims, the singular forms "a", "an", "the", include plural referents unless the context clearly dictates otherwise.

The present invention provides methods for protecting a substrate for use in a later thin film growth method. The method generally comprises passivation of at least a portion of a surface of the substrate. As used herein, "passivation" is understood to mean making the substrate surface less reactive or inactive, particularly by forming a coating thereon.

As previously pointed out, the growth of a thin film on a substrate can be greatly affected by the method by which the substrate surface is prepared. Known methods for surface preparation of a substrate (such as an aluminum nitride wafer) typically include polishing and surface cleaning (either wet or dry). A consequence of the use of water during polishing an aluminum nitride (AlN) substrate is the formation of a layer of aluminum oxide-hydroxide on the surface of the AlN substrate. The chart provided in FIG. 1 shows the surface molar fraction of the different elemental species found on the surface of an AlN crystal after undergoing one of the following four surface preparation procedures: polishing; wet etching; $NH_3$ annealing; or vacuum annealing. The surface molar fraction was determined by X-ray Photoelectron Spectroscopy (XPS).

The stoichiometric ratio between aluminum and nitrogen in an AlN substrate should be 1:1. As seen in FIG. 1, however, these surface preparation methods skew the stoichiometric ratio such that excess aluminum is present at the substrate surface. The excess aluminum above the 1:1 ratio is bound in oxide-hydroxide compounds, which are indicated by the presence of oxygen in FIG. 1. These compounds are present in a layer that is estimated to have a thickness of at least 1 nm (which can be estimated from the chemical compositions and molar fractions provided by the XPS analysis).

Oxygen present at the substrate surface can be present in multiple different types of oxygen bonds, including H—O—H bonds (e.g., water that is physisorbed on the substrate surface), OH bonds, and $O^{2-}$ bonds, and the oxygen bonding ratio can vary depending upon the type of treatment used. For example, FIG. 2 illustrates the molar fraction of the type of oxygen bonding for total surface oxygen in an aluminum nitride substrate having undergone mechanical polishing. The predominant compound formed by oxygen bonding with excess aluminum is the compound aluminum hydroxide. Chemically speaking, aluminum hydroxide is understood to have the formula $Al(OH)_3$. This is an idealized formula that, in the actual practice of aluminum nitride substrate surface preparation is never achieved. Rather, in stoichiometric terms, oxygen binds aluminum in both the $O^{2-}$ state and the $OH^-$ state, and the exact stoichiometry can change, In particular, the present invention has realized the ability to passivated the surface of an aluminum nitride substrate by shifting the stoichiometric ratio of $O^{2-}$ bonding and $OH^-$ bonding toward $OH^-$ bonding (i.e., more toward being a pure hydroxide). For example, assuming all excess aluminum is bonded as oxides (neglecting any H—O—H bonds present), the oxide hydroxide compound on the as-polished surface of the aluminum nitride surface is, stoichiometrically, $AlO_{0.4}OH_{1.3}$, while the oxide hydroxide compound after the wet etch is $AlO_{0.6}OH_{2.1}$ (i.e., closer to being a pure hydroxide).

The molar ratios illustrated in FIG. 2 are from one specific example, wherein the ratios were calculated after mechanical polishing, performing a wet etch according to the invention, performing an ammonia anneal according to the invention, and performing a vacuum anneal. As polished, the hydroxide component ($OH^-$) made up about 60% of the total oxygen surface molar fraction. Oxygen bound in the H—O—H and $O^{2-}$ states was also present, and each of these types of compounds made up approximately 20% of the total oxygen surface molar fraction. The presence of the $O^{2-}$ bonds is particularly undesirable because of the inherent difficulty in removing oxygen in this bonding state.

The content of surface bound oxygen on an aluminum nitride substrate in the freshly polished state can vary depending upon the nature of the substrate (i.e., an "as-grown" AlN bulk crystal versus a "processed" single crystal AlN wafer), as well as the polishing method used. Typically, the molar content of surface bound oxygen on an aluminum nitride substrate in the freshly polished state that is present in the $OH^-$ binding state is about 45% to about 60%. The remaining molar content of oxygen present on the aluminum nitride substrate surface is present in other binding states that are less preferred or undesirable (e.g., H—O—H and $O^{2-}$). The present invention provides a method of passivating an aluminum nitride substrate surface by shifting the molar ratio of the oxygen binding states toward the more favorable $OH^-$ state.

The present invention is particularly beneficial because, independent of the initial state of the aluminum nitride substrate (e.g., independent of the crystal orientation or the polish), the state of the substrate surface will have consistent, measurable, and desirable properties. In particular, after carrying out a wet etch according to the invention, the predominant type of oxygen bonding present at the substrate surface is $OH^-$. Furthermore, overall oxygen content and excess aluminum content can both be reduced. As previously described, the thickness of an aluminum hydroxide layer can be estimated from its chemical composition and molar fractions, such as provided by XPS analysis. The passivating methods of the present invention can thus be self-evidenced. For example, the corresponding reductions in oxygen and excess aluminum can be indicated by a decrease in the thickness of the passivation layer. Likewise, a thinner passivating aluminum hydroxide layer can indicate the desired reductions in oxygen and excess aluminum have been achieved.

The present invention provides methods for forming protective layers on substrates useful in the growth of thin films. In particular, the invention is useful for preparing aluminum nitride based substrates for later film growth. Such preparation can include the forming of a passivating or protective layer on at least a portion of a surface of the substrate and removing at least a portion of the passivating layer. It is desirable for the aluminum nitride substrates to be in an optimal condition for Group III nitride film layer growth, such as epitaxial thin film growth or other thin film deposition technologies. Providing "optimal" conditions for thin film growth on polished substrates can include removal of particulates, metallic contaminants, adsorbed species, and native oxides. The present invention is useful to achieve all of these requirements. Accordingly, the process of the present invention is particularly beneficial in that it not only provides a protective layer but also provides a metals free surface. This is highly useful since metal contamination is common after polishing processes.

Given the beneficial substrate preparation provided by the invention, various substrates can be used, and the substrate preparation can be appropriately tailored to the substrate. Substrates commonly used in film growth methods, such as chemical vapor deposition (CVD), can particularly be used in the present invention. For example, any aluminum nitride based substrate can be used, including single crystal aluminum nitride wafers. Aluminum nitride substrates, which provide excellent heat dissipation (e.g., up to 320 W/mK), are particularly useful in the production of small, high-power microelectronic circuits and other high thermal hazard-free applications. Aluminum nitride substrates provide the following beneficial characteristics: high thermal conductivity; low thermal expansion coefficient closely matching silicon; good dielectric strength; low toxicity (and therefore excellent replacement for BeO); good shock and corrosion resistance; low dielectric loss; high temperature stability; high flexure strength; light weight; resistance to wafer processing gasses and plasma erosion; conducive to finishing operations such as lasering, lapping, and polishing; useful substrate for direct bond copper DBC; and good adhesion for thin and thick film applications. Any aluminum nitride substrate having one or more of the above qualities could be used according to the present invention.

In particular embodiments, the substrate comprises an aluminum nitride single crystal wafer. For example, it could be a wafer that has been cut from an aluminum nitride boule. Moreover, the wafer may be provided with a polished, "epiready" finish. The phrase "epiready" is an understood industry phrase used to indicate the wafer is ready for use in an epitaxy method without further treatment. Unfortunately, as more fully described herein, aluminum nitride substrates are subject to formation of layers (e.g., oxide-hydroxide compounds) that hinder epitaxy and that are not easily removed. Thus, "epiready" aluminum nitride substrates tend to have a limited useable lifetime and cannot be stored long-term for later use. The present invention solves this problem, particularly in relation to aluminum nitride substrates. The method of the invention may be used with further substrates, though, such as other Group III nitride substrates, including gallium nitride. For example, in certain embodiments, the invention comprises a method of protecting a surface of a gallium nitride substrate from oxidation, the method comprising forming a passivating layer on at least a portion of the substrate surface by applying a wet chemical etch to the substrate surface. Specifically, the method can comprise increasing the molar ratio of oxygen that is bound in the gallium hydroxide bonding state in relation to other oxygen species.

The substrates prepared according to the methods of the invention can be used in a variety of methods for preparing Group III nitride films, including chemical vapor deposition (CVD) processes. Particular types of CVD that can be used with the substrates according to the invention include Metal Organic Chemical Vapor Deposition (MOCVD), Metal Organic Vapor Phase Epitaxy (MOVPE), and Hydride Vapor Phase Epitaxy (HVPE). MOVPE, in particular, is a well-established technique for epitaxial growth of Group III-nitrides and is useful for preparing films, and associated devices, according to very demanding specifications, including fine control of layer thickness, interface structure, material composition, and impurity concentration.

The present invention provides methods for passivating a surface of an aluminum nitride substrate. The methods of the invention can also be characterized as providing for formation of a protective layer on a surface of an aluminum nitride substrate. Formation of a passivating layer is useful to provide protection to the substrate and prevent damage to the substrate surface or formation of layers that are not easily removable. Thus, it is preferable that the passivating layer formed on the substrate be an easily removable layer.

In specific embodiments, the method of forming a passivating layer may particularly comprise altering or adjusting the ratio of oxygen that is bound in a surface layer on the aluminum nitride substrate to increase the content of oxygen that is bound in the $OH^-$ or hydroxyl state. Preferably, the passivating layer is a layer wherein bound oxygen is present predominately in the $OH^-$ or hydroxyl state. More specifically, this can mean that the formed passivating layer comprises greater than 60% of surface oxygen, on a molar basis, bound in the $OH^-$ or hydroxyl state. As used in the present disclosure, forming (or being formed) can mean altering an existing substrate surface layer by changing the oxygen binding molar ratio. In further embodiments, a passivating layer on an aluminum nitride substrate surface formed according to the present invention has at least 61%, at least 62%, at least 63%, at least 64%, at least 65%, at least 66%, at least 67%, at least 68%, at least 69%, at least 70%, at least 75%, or at least 80%, on a molar basis, of the oxygen bound at the surface in the $OH^-$ or hydroxyl state. In other embodiments, about 60% to about 99%, about 60% to about 98%, about 60% to about 97%, about 60% to about 96%, about 60% to about 95%, about 60% to about 90%, about 65% to about 90%, about 65% to about 85%, or about 65% to about 80% of the oxygen bound at the surface of the aluminum nitride substrate is bound in the $OH^-$ or hydroxyl state.

In still further embodiments, the passivation methods of the invention can be characterized in terms of an increase of the molar percentage of oxygen that is bound in the $OH^-$ or hydroxyl state. In other words, a previously polished aluminum nitride substrate surface may comprise an aluminum oxide hydroxide layer wherein a specific molar percentage of the bound oxygen is bound in the OH⁻ or hydroxyl state, and a specific percentage of the bound oxygen is bound in other states (e.g., $O^{2-}$ or H—O—H). The method of the present invention may then comprising shifting the molar ratio of bound oxygen to increase the percentage of oxygen that is bound in OH⁻ or hydroxyl state. In some embodiments, forming a passivation layer comprises increasing the amount of oxygen that is bound in the OH⁻ state by at least about 5 percentage points (e.g., increasing the amount of oxygen bound in OH⁻ state from 45% to 50%). In other embodiments, forming a passivation layer comprises increasing the amount of oxygen that is bound in OH⁻ state by at least about 6 percentage points, at least about 7 percentage points, at least about 8 percentage points, at least about 9 percentage points, at least about 10 percentage points, at least about 11 percentage points, at least about 12 percentage points, at least about 13 percentage points, at least about 14 percentage points, at least about 15 percentage points, or at least about 20 percentage points. In specific embodiments, forming a passivation layer comprises increasing the amount of oxygen that is bound in OH⁻ state by about 5 percentage points to about 30 percentage points, about 5 percentage points to about 25 percentage points, about 10 percentage points to about 30 percentage points, about 10 percentage points to about 25 percentage points, or about 10 percentage points to about 20 percentage points.

The molar content of oxygen and its bound state can be determined through testing methods, such as described herein. In particular, oxygen binding ratios can be determined by XPS analysis, such as using a VG Microtech Clam 2 Hemispherical Electron Spectrometer (available from VG Scientific, United Kingdom). One test method useful in analyzing oxygen binding ratios using XPS analysis is provided in R. Dalmau, R. Collazo, S. Mita, and Z. Sitar, "X-Ray Photoelectron Spectroscopy Characterization of Aluminum Nitride Surface Oxides: Thermal and Hydrothermal Evolution", *Journal of Electronic Materials*, Vol. 36, No. 5, 414 (2007), which is incorporated herein by reference in its entirety.

In certain embodiments, the method comprises applying a wet chemical etch to the substrate surface. In particular, the wet chemical etch is a treatment that forms an aluminum hydroxide layer on the surface of the substrate.

Chemical etching typically refers to a process by which material is removed from a substrate surface. Wet etching is understood to be a process that utilizes liquid chemicals or etchants to remove materials from the surface, usually in specific patterns. A simple wet etching process may just consist of dissolution of the material to be removed in a liquid solvent, without changing the chemical nature of the dissolved material. Often, however, a wet etching process involves one or more chemical reactions that consume the original reactants and produce new species on the surface. Reduction-oxidation (redox) reactions are commonly encountered in wafer wet etching processes.

It has been found according to the present invention that, rather than removing portions of a substrate or film surface, a wet etching process can be used to form a passivating or protective layer on at least a portion of the surface of an aluminum nitride substrate. In some embodiments, the wet etch is carried out in relation to the entire substrate surface that may later be used in the growth of a film. The invention also encompasses applying the wet etch to only a portion of the substrate surface (i.e., selectively passivating the substrate surface). Such selective passivation can be useful to provide for desired patterning of the surface. The formation of this passivating layer protects the substrate and prevents formation of undesirable layers. The substrate is thus maintained in a condition whereby, after removal of the passivating layer, the substrate is desirably conditioned for facilitating film deposition of specific properties. Moreover, as previously noted, the passivating method itself can be useful to further place the substrate in condition of use in growing Group III nitride films (e.g., by producing a metals free surface).

In specific embodiments, the method of passivating or protecting at least a portion of the surface of the substrate comprises subjecting the substrate surface to a wet etch process. The wet etch applied according to the invention may particularly comprise the use of an acid (which may be referred to as an acid etchant). In other embodiments, however, the wet etch applied may comprise the use of a base. The selection of an acid etch and/or a base etch can depend upon a variety of specific criteria, such as the plane (or orientation) of the substrate surface subject to passivation.

An acid etch according to the invention can be carried out using a variety of acids. Non-limiting examples of acids that may be used include sulfuric acid, phosphoric acid, hydrofluoric acid, and combinations thereof. Of course, any acids useful for metal etching and/or oxide hydration could be used according to the invention (including salts that provide acid species in aqueous solution). In specific embodiments, the acid used in the acid etch step comprises a mixture of acids (e.g., sulfuric acid and phosphoric acid). The ratio of acids in acid mixtures can vary. It is preferred that the concentration of phosphoric acid (or similar species) be relatively low to avoid damaging the aluminum nitride substrate. For example, in embodiments comprising mixtures of sulfuric acid and phosphoric acid, the ratio of sulfuric acid to phosphoric acid (on a volume basis) can be in the range of about 1.5:1 to about 10:1, preferably about 2:1 to about 5:1, more preferably about 2:1 to about 4:1. In one embodiment, the ratio of sulfuric acid to phosphoric acid is about 3:1.

In other embodiments where two or more acids are used in the wet etch, the acids may be applied sequentially. For example, again using the example of sulfuric acid and phosphoric, a wet etch could be performed using sulfuric acid sequentially followed by etching with phosphoric acid. These can be distinct steps or can be essentially a single step wherein the first acid is applied followed closely in time by application of the second acid. Of course, a skilled person with the benefit of the present disclosure could envision multiple variations of using multiple acids in the wet etch process, and all such variations are intended to be encompassed by the present invention, which is merely exemplified by these specific embodiments for the sake of complete disclosure.

The conditions for carrying out the acid etch according to the invention are preferably controlled to within relatively close ranges to avoid damaging the aluminum nitride substrate. In certain embodiments, the acid etch can be carried out at a temperature of at least about 80° C., at least about 85° C., at least about 90° C., or at least about 95° C. In other embodiments, the acid etch can be carried out at a temperature of about 80° C. to about 120° C., about 80° C. to about 115° C., about 80° C. to about 110° C., about 80° C. to about 105° C., about 85° C. to about 100° C., or about 90° C. to about 100° C. In a specific embodiment, the acid etch is carried out at a temperature of about 100° C. The increased reaction temperature is particularly useful to increase the speed of the passivation process. Although not wishing to be bound by theory, it is believed that the use of temperatures significantly above 100° C. may render the hydroxide species unstable (as seen in FIG. 3). Thus, the use of temperatures around 100° C. can be useful to speed the reaction without rendering the passivation layer unstable, as provided by the acid mixture.

It can likewise be useful to avoid conducting the acid etch for an extended period of time, again to avoid damaging the aluminum nitride substrate. In some embodiments, it is useful for the acid etch to be conducted for a time of less than about 15 minutes, less than about 12 minutes, or less than about 10 minutes. In other embodiments, it is useful for the acid etch to be conducted for a time of about 1 minute to about 15 minutes, about 1 minute to about 10 minutes, about 5 minutes to about 15 minutes, or about 5 minutes to about 10 minutes. By being conducted in the noted time frame, it is meant that that acid etchant is applied to the substrate surface and allowed to remain thereon for the noted time period. The acid etchant can be applied by any known method, such as spraying, brushing, rolling, dipping, or the like.

After the acid etchant has been applied for the desired time period, the acid etchant can be removed from the substrate surface. For example, if the acid etchant was applied by dipping, the substrate may simply be withdrawn from the acid etchant and allowed to dry (either passively or actively—e.g., wiping or applying forced air and/or heat). When application is by spraying, brushing, rolling, or the like, the acid etchant may likewise be removed by wiping or applying forced air and/or heat. In certain embodiments, residual acid etchant may be removed by rinsing. For example, the acid etchant could be removed by rinsing with water, particularly deionized water. Any rinsing method could be used. Preferably, rinsing is carried out for a time of about 1 minute to about 10 minutes.

A wet etch using a base according to the invention can be carried out using a variety of bases. Non-limiting examples of bases that may be used include hydroxides, such as sodium hydroxide, potassium hydroxide, calcium hydroxide, magnesium hydroxide, and combinations thereof. Of course, any bases useful for metal etching and/or oxide hydration could be used according to the invention (including salts that provide basic species in aqueous solution). Moreover, the base used in the wet etch step may comprise a mixture of bases in varying ratios applied in combination or sequentially. The conditions for carrying out a wet etch according to the invention using a base can generally be as described above in relation to acid etches.

The wet etch of the present invention may include one or more further steps. For example, in some embodiments, it may be desirable to clean the aluminum nitride substrate prior to the acid etch (or base etch). Such cleaning step may make use of a variety of cleaners and may particularly make use of an organic solvent. Non-limiting examples of organic compounds that may be used include chlorinated hydrocarbons, ketones, and alcohols, more particularly trichloroethylene, acetone, methanol, and combinations thereof. Such cleaning can be carried out substantially at room temperature for a time of less than about 10 minutes. In specific embodiments, cleaning can comprise cleaning the substrate using, sequentially, trichloroethylene, acetone, and methanol. Specifically, each clean can be carried out at ambient conditions for a time of about 3 minutes. Such cleaning may be followed by a rinse, such as with deionized water.

The method of forming a passivating layer provided by the present invention is particularly useful since a layer having bound oxygen present predominately in the OH⁻ or hydroxyl state is easier to remove from an aluminum nitride substrate surface than layers having greater concentrations of other bound oxygen species. The chart of FIG. 1 illustrates that for a wet etch (such as according to the present invention), there is a decrease in the surface molar fraction of oxygen, and there is an increase in the molar fraction of both aluminum and nitrogen (as compared to the polished state). Moreover, as seen in FIG. 1, the application of a wet etch according to the invention results in a reduction in the difference between the molar fractions of nitrogen and aluminum. In other words, $M_{Al}$–$M_N$ after the wet etch is less than $M_{Al}$–$M_N$ after the polish (wherein $M_{Al}$ is the molar fraction of aluminum and $M_N$ is the molar fraction of nitrogen). This indicates that the application of the wet etch results in a reduction in the amount of aluminum that is bonded to oxygen. The remaining surface layer is mainly an aluminum hydroxide layer wherein the bound oxygen is predominately in the OH⁻ state. In certain embodiments, the passivating layer has a thickness of less than about 2 nm, less than about 1.5 nm, or less than about 1 nm. Formation of an aluminum hydroxide passivating layer wherein oxygen is bound predominately in the OH⁻ state is highly beneficial because such an aluminum hydroxide layer is a stable phase at room temperature, even under humid conditions. Further, away from direct contact with water or high temperatures, the aluminum hydroxide passivating layer has no driving force for growth.

The beneficial stability of the aluminum hydroxide passivating layer formed according to the invention can be seen further in relation to FIG. 3, which shows the free energy of the hydration reaction of aluminum oxide as a function of temperature for two different hydroxide products. As seen in FIG. 3, at temperatures approximating room temperature (i.e., 300 K or about 27° C.), the free energy of reaction of the aluminum tri-hydroxide (i.e., stoichiometrically pure aluminum hydroxide) is lower by 4 kJ/mol than that for the aluminum oxide-hydroxide. Therefore, it is evident that aluminum hydroxide is a stable phase that acts as a passivating layer, thus preventing further oxidation of the surface of an aluminum nitride substrate. Accordingly, the present invention, in certain embodiments, provides methods of forming a passivating layer (i.e., a protective layer) on at least a portion of a surface of an aluminum nitride substrate (e.g., an AlN single crystal wafer), the methods comprising using a wet etching process, as described herein, to purposely form an aluminum hydroxide layer on the substrate surface wherein oxygen is bound predominately in the OH⁻ state.

Beneficially, the passivating layer formed on the substrate surface according to the invention is easily removable. In certain embodiments, the passivating layer can be easily removed in a typical thin film deposition reactor. While formation of the passivating layer on the aluminum nitride substrate surface is referred to herein as passivation or forming a protective layer, removal of the passivating or protecting layer can be referred to as activating the aluminum nitride substrate surface. Whereas the passivating layer prevents formation of other layers on the substrate surface, activating the substrate removes the passivating layer and restores the substrate surface to an active state (i.e., a state wherein epitaxial growth of an aluminum nitride film can be initiated). Preferentially, an active state according to the invention is a state wherein optimal conditions for epitaxial growth are achieved (as described previously). In one sense, the formation of the passivating layer actually assists in later providing an active state in light of the ability to provide a metals free surface. In other embodiments, an active state can be described as a state wherein the Al:N stoichiometric ratio is about 1 (i.e., from 1 to about 1.1 and preferably from 1 to about 1.05, and more preferably from 1 to about 1.025). A ratio of 1 indicates the substrate surface is free of oxides since there is no excess Al to bind oxygen.

In certain embodiments of the invention, activation of the passivated surface of the aluminum nitride substrate for film growth (e.g., epitaxial thin film growth) can comprise removing the aluminum hydroxide passivation layer present on the substrate surface. In specific embodiments of the invention, activation of the passivated substrate surface comprises annealing the substrate. The step of annealing the passivated substrate surface can comprise supplying a flow of a reactive nitrogen precursor at high temperature for a specified period of time. Any nitrogen source providing reactive nitrogen would be understood as being useful according to the invention. In one preferred embodiment, the nitrogen source is ammonia ($NH_3$). Non-limiting examples of other nitrogen sources that could be used include amine organic compounds and hydrazine compounds. Annealing according to the invention may also be carried out in the presence of a reducing agent, such as hydrogen.

The thermal anneal is preferably carried out a temperature of at least about 500° C. In certain embodiments of the invention, the temperature during the annealing step is between about 500° C. and about 1,500° C. In particular, the annealing step can begin at a temperature in the lower end of the range and be ramped up to a final annealing temperature. Alternately, a majority of the annealing can be performed within a specified temperature range. In specific embodiments, the annealing temperature is between about 900° C. and about 1,400° C., between about 1,000° C. and about 1,350° C., between about 1,100° C. and about 1,300° C., or between about 1,200° C. and about 1,260° C. Of course, the required temperature may be affected by reactor contaminants (e.g., water).

The amount of time during which the annealing step is carried out can depend upon the annealing temperature. Although not wishing to be bound by theory, it is believed that higher reaction temperatures can allow for shorter reaction times. Nevertheless, since the passivation layer is a thin, amorphous layer, it is preferred for the annealing step to be carried in a relatively short period of time. In certain embodiments, the annealing time can be between about 5 minutes and about 45 minutes, between about 7 minutes and about 40 minutes, between about 10 minutes and about 30 minutes, or between about 15 minutes and about 25 minutes.

The reactive nitrogen precursor used in the annealing step is preferably provided with at least a minimum partial pressure. Although not intending to be limited by theory, the minimum partial pressure is believed to be necessary to avoid an unintended oxidation which could otherwise occur at the elevated anneal temperature. In some embodiments, the partial pressure of the reactive nitrogen precursor is at least about 30 Torr, at least about 40 Torr, or at least about 50 Torr. In other embodiments, the partial pressure is in the range of about 30 Torr to about 90 Torr, about 40 Torr to about 80 Torr, about 50 Torr to about 70 Torr, or about 55 Torr to about 65 Torr.

The presence of the reactive nitrogen precursor is necessary to ensure that the aluminum nitride substrate surface re-achieves the desired stoichiometric ratio between the aluminum and the nitrogen (i.e., an Al:N ratio of about 1) as is present in the bulk of the substrate. As seen in FIG. 1, this desired ratio is achieved after an anneal step in the presence of ammonia according to an embodiment of the present invention. Thus, there is no excess aluminum bonded to oxygen after the ammonia anneal step. As seen in FIG. 1, there is still evidence of oxygen present on the surface of the substrate. The oxygen is not present immediately after the ammonia anneal but is introduced to the substrate surface from the ambient atmosphere when the substrate is moved from the deposition reactor (where the ammonia anneal occurred) to the tool used to characterize the surface properties of the substrate. This oxygen content is merely adsorbed to the top layer of the substrate surface and does not form an oxide layer. On the contrary, carrying out the annealing step in an ultra high vacuum (UHV) condition at a temperature above 500° C. induces a transformation of the surface in which excess aluminum is bonded to oxygen that is present, thus re-forming the oxide-hydroxide layer. After the UHV anneal step, the re-formation of the oxide-hydroxide layer is evidenced by the presence of excess aluminum in relation to nitrogen.

It is also preferable that the annealing step be carried out in the substantial absence of water. As used herein, the phrase "substantial absence of water" is intended to mean that there is little or no water vapor present. The phrase can be used in relation to the reactive nitrogen precursor that is provided in the annealing step. In specific embodiments, the reactive nitrogen precursor is provided with a water content of less than about 1 ppm, less than about 0.8 ppm, or less than about 0.5 ppm.

Further to the above, the reactive nitrogen precursor can also be provided with a diluent gas in certain embodiments. Any gas that is substantially non-reactive with the aluminum nitride substrate under the annealing conditions could be used as the diluent gas. Any inert gas, such as nitrogen, helium, argon, and the like could be used. In specific embodiments, nitrogen gas ($N_2$) is used as the diluent gas. It is also preferable that the diluent gas is provided in the substantial absence of water. In some embodiments, the diluent gas is provided with a water content of less than about 1 ppm, less than about 0.8 ppm, or less than about 0.5 ppm.

Carrying out the annealing step in the substantial absence of water can also be related to the overall process. In such embodiments, carrying out the annealing process in the substantial absence of water means that the aluminum nitride substrate is not exposed to water vapor with a partial pressure of greater than $1 \times 10^{-5}$ Torr.

In another aspect, the present invention also provides substrates having at least a portion of the substrate surface protected such that the substrate can be later activated to be in desirable state for aluminum nitride film growth. In certain embodiments, the invention provides an aluminum nitride substrate having a surface, at least a portion of which is protected by a passivating layer formed of compounds comprising aluminum and oxygen, wherein any oxygen bound to the aluminum is predominately in the $OH^-$ state, as described herein. In particular, the aluminum nitride substrate is an aluminum nitride single crystal wafer (e.g., a wafer that has been cut from an aluminum nitride boule). In some embodiments, the aluminum nitride wafer has been previously polished so that it can be considered to have an epiready finish. As noted above, an epiready finish is understood in the art to indicate the substrate surface is in a condition ready for epitaxial procedures without further processing to prepare the substrate surface.

In such embodiments, the aluminum nitride wafer can be described as having a polished surface. The phrase "polished surface" goes beyond describing the method of preparation and actually describes the physical condition of the aluminum nitride substrate. For example, as described above in relation to FIG. 1, the surface molar fraction of the substrate changes depending upon the state of the substrate in relation to the treatments it has undergone. Accordingly, an aluminum nitride single crystal wafer having a polished surface actually describes a substrate having a specific chemical makeup.

Many modifications and other embodiments of the inventions set forth herein will come to mind to one skilled in the art That which is claimed:

1. An aluminum nitride substrate comprising a polished surface that is at least partially covered with a passivating layer having a content of surface bound oxygen, wherein greater than 60% of the surface bound oxygen, on a molar basis, is in the OH⁻ state, and wherein the passivating layer exhibits a decreased surface molar fraction of oxygen and an increased surface molar fraction of both nitrogen and aluminum as compared to the substrate surface in the polished state.

2. The aluminum nitride substrate of claim 1, wherein at least 70% of the surface bound oxygen is in the OH⁻ state.

3. The aluminum nitride substrate of claim 1, wherein about 65% to about 90% of the surface bound oxygen is in the OH⁻ state.

4. The aluminum nitride substrate of claim 1, wherein the substrate comprises a content of a further Group III element.

5. The aluminum nitride substrate of claim 1, wherein the substrate is an aluminum nitride single crystal wafer.

6. The aluminum nitride substrate of claim 1, wherein the polished surface is epiready.

7. The aluminum nitride substrate of claim 1, wherein the passivating layer has a thickness of less than about 2 nm.

8. The aluminum nitride substrate of claim 7, wherein the passivating layer has a thickness of less than about 1.5 nm.

9. The aluminum nitride substrate of claim 1, wherein the passivating layer is stable at room temperature and humidity such that oxidation of the polished surface covered with the passivating layer is prevented.

10. The aluminum nitride substrate of claim 1, wherein the passivating layer is formed by applying a wet chemical etch to the substrate surface at a temperature of about 80° C. to about 120° C.

11. The aluminum nitride substrate of claim 10, wherein the wet chemical etch comprises an acid.

12. The aluminum nitride substrate of claim 10, wherein the wet chemical etch comprises a base.

13. An aluminum nitride substrate comprising a polished surface that is at least partially covered with a passivating layer having a content of surface bound oxygen, wherein greater than 60% of the surface bound oxygen, on a molar basis, is in the OH⁻ state, and wherein the passivating layer exhibits a reduction in the difference between the molar fractions of nitrogen and aluminum ($M_{Al}-M_N$) compared to the polished state such that $M_{Al}-M_N$ of the passivating layer is less than $M_{Al}-M_N$ of the substrate surface in the polished state.

14. The aluminum nitride substrate of claim 13, wherein at least 70% of the surface bound oxygen is in the OH⁻ state.

15. The aluminum nitride substrate of claim 13, wherein about 65% to about 90% of the surface bound oxygen is in the OH⁻ state.

16. The aluminum nitride substrate of claim 13, wherein the substrate comprises a content of a further Group III element.

17. The aluminum nitride substrate of claim 13, wherein the substrate is an aluminum nitride single crystal wafer.

18. The aluminum nitride substrate of claim 13, wherein the polished surface is epiready.

19. The aluminum nitride substrate of claim 13, wherein the passivating layer has a thickness of less than about 2 nm.

20. The aluminum nitride substrate of claim 19, wherein the passivating layer has a thickness of less than about 1.5 nm.

21. The aluminum nitride substrate of claim 13, wherein the passivating layer is stable at room temperature and humidity such that oxidation of the polished surface covered with the passivating layer is prevented.

22. The aluminum nitride substrate of claim 13, wherein the passivating layer is formed by applying a wet chemical etch to the substrate surface at a temperature of about 80° C. to about 120° C.

23. The aluminum nitride substrate of claim 22, wherein the wet chemical etch comprises an acid.

24. The aluminum nitride substrate of claim 22, wherein the wet chemical etch comprises a base.

25. An aluminum nitride substrate comprising a polished surface that is at least partially covered with a passivating layer having a content of surface bound oxygen, wherein greater than 60% of the surface bound oxygen, on a molar basis, is in the OH⁻ state, and wherein the passivating layer exhibits a reduced amount of aluminum that is bonded to oxygen compared to the amount of aluminum bonded to oxygen when the substrate surface is in the polished state.

26. The aluminum nitride substrate of claim 25, wherein at least 70% of the surface bound oxygen is in the OH⁻ state.

27. The aluminum nitride substrate of claim 25, wherein about 65% to about 90% of the surface bound oxygen is in the OH⁻ state.

28. The aluminum nitride substrate of claim 25, wherein the substrate comprises a content of a further Group III element.

29. The aluminum nitride substrate of claim 25, wherein the substrate is an aluminum nitride single crystal wafer.

30. The aluminum nitride substrate of claim 25, wherein the polished surface is epiready.

31. The aluminum nitride substrate of claim 25, wherein the passivating layer has a thickness of less than about 2 nm.

32. The aluminum nitride substrate of claim 31, wherein the passivating layer has a thickness of less than about 1.5 nm.

33. The aluminum nitride substrate of claim 25, wherein the passivating layer is stable at room temperature and humidity such that oxidation of the polished surface covered with the passivating layer is prevented.

34. The aluminum nitride substrate of claim 25, wherein the passivating layer is formed by applying a wet chemical etch to the substrate surface at a temperature of about 80° C. to about 120° C.

35. The aluminum nitride substrate of claim 34, wherein the wet chemical etch comprises an acid.

36. The aluminum nitride substrate of claim 34 wherein the wet chemical etch comprises a base.

* * * * *